(12) United States Patent
Raghavan et al.

(10) Patent No.: US 10,355,128 B2
(45) Date of Patent: Jul. 16, 2019

(54) DOUBLE-GATE VERTICAL TRANSISTOR SEMICONDUCTOR DEVICE

(71) Applicants: IMEC VZW, Leuven (BE); Katholieke Universiteit Leuven, KU LEUVEN R&D, Leuven (BE)

(72) Inventors: Praveen Raghavan, Leefdaal (BE); Odysseas Zografos, Leuven (BE)

(73) Assignees: IMEC VZW, Leuven (BE); KATHOLIEKE UNIVERSITEIT LEUVEN, KU LEUVEN R&D, Leuven (BE)

( * ) Notice: Subject to any disclaimer, the term of this patent is extended or adjusted under 35 U.S.C. 154(b) by 0 days.

(21) Appl. No.: 15/835,703

(22) Filed: Dec. 8, 2017

(65) Prior Publication Data

US 2018/0175193 A1   Jun. 21, 2018

(30) Foreign Application Priority Data

Dec. 20, 2016   (EP) .................................... 16205495

(51) Int. Cl.
*H01L 29/78* (2006.01)
*H01L 29/66* (2006.01)
*H01L 21/8234* (2006.01)

(52) U.S. Cl.
CPC ...... *H01L 29/7827* (2013.01); *H01L 29/7831* (2013.01); *H01L 21/823437* (2013.01); *H01L 21/823487* (2013.01); *H01L 29/66666* (2013.01)

(58) Field of Classification Search
CPC .... H03K 17/687; H03K 19/20; H03K 19/215; H03K 19/23; H01L 29/42392; H01L 29/7827; H01L 29/78642; H01L 29/66666; H01L 45/1233; H01L 51/0048; H01L 27/2454; H01L 29/66909; H01L 29/7889; H01L 2924/00; H01L 2224/32225; H01L 2224/73204; H01L 2224/16225; H01L 2224/48227; H01L 2224/73265;

(Continued)

(56) References Cited

U.S. PATENT DOCUMENTS 8,213,226 B2 *  7/2012  Carman ................ G11C 11/404
                                                      365/103
2011/0169067 A1 *  7/2011  Ernst ................... H01L 21/8221
                                                      257/316

(Continued)

*Primary Examiner* — Jonathan Han
(74) *Attorney, Agent, or Firm* — McDonnell Boehnen Hulbert & Berghoff LLP (57) ABSTRACT

A semiconductor device is disclosed that includes a substrate and at least a first, second, third, and fourth vertical transistor supported by the substrate. Each transistor comprises a vertical channel, a polarity gate electrode forming a polarity gate adapted to act on a first portion of the channel to affect a polarity of the channel, and a control gate electrode forming a control gate adapted to act on a second portion of the channel to control the electrical conductivity of the channel. The polarity gate electrode and the control gate electrode of each one of the transistors extend laterally from their respective gate and in mutually opposite directions, and the transistors are laterally spaced from each other and arranged such that the control gate electrodes of the first and third transistor face each other and the control gate electrodes of the second and fourth transistor face each other.

20 Claims, 4 Drawing Sheets

(58) Field of Classification Search
CPC ... H01L 2924/12032; H01L 2924/1305; H01L 2924/13062; H01L 27/0688; H01L 27/10802; H01L 29/785; H01L 27/2436; H01L 21/84; H01L 27/092; H01L 21/76254; G11C 2213/71; B82Y 10/00
USPC ..... 257/E21.614, 67, 401, E23.145, E21.41, 257/E29.262, 280, 302; 438/212, 268
See application file for complete search history.

(56) References Cited

U.S. PATENT DOCUMENTS

2014/0043060 A1* 2/2014 Amaru ................ H03K 19/20
326/36
2014/0124729 A1* 5/2014 Hwang ............... H01L 45/1608
257/5

* cited by examiner

DOUBLE-GATE VERTICAL TRANSISTOR SEMICONDUCTOR DEVICE

CROSS-REFERENCE TO RELATED APPLICATIONS

The present application is a non-provisional patent application claiming priority to EP Patent Application No. 16205495.1, filed Dec. 20, 2016, the contents of which are hereby incorporated by reference.

FIELD OF THE DISCLOSURE

The present disclosure relates to the field of semiconductor devices. In particular, the present disclosure relates to semiconductor devices comprising double-gate vertical transistors and the layout of such devices.

BACKGROUND

In semiconductor fabrication, standard cell methodology typically involves designing integrated circuits having various functionality using standard components and interconnected structures. A standard cell can be made up of a group of transistor structures, passive structures, and interconnect structures that make up, e.g., logic functions, storage functions, or the like.

As integrated circuits continue to become smaller and simultaneously comprise an increasing number of electronic components within a given area, there is a desire for reducing the footprint of the devices and thus the size of the standard cell. However, as the devices become smaller, they also become more difficult to access by electrical interconnects.

Thus, there is a need for improved technologies providing smaller devices that still are easy to access and integrate in integrated circuit architectures.

SUMMARY

In view of the above, an objective of the present disclosure is to provide a semiconductor device and layout which allows for further reduction of the footprint without impairing the accessibility of the device. Additional and alternative objects may be understood from the following.

According to an aspect of the present disclosure, a semiconductor device is provided. In an example embodiment, the semiconductor device includes a substrate and at least a first, a second, a third, and a fourth vertical transistor supported by the substrate. Each one of the transistors comprises: (i) a vertical channel having a length axis perpendicular to a main plane of extension of the substrate, (ii) a polarity gate electrode forming a polarity gate adapted to act on at least a first portion of the channel to affect a polarity of the channel, and (iii) a control gate electrode forming a control gate adapted to act on a second portion of the channel to control the electrical conductivity of the channel. The polarity gate electrode and the control gate electrode of each one of the transistors extend laterally from their respective gate and in mutually opposite directions. The transistor channels are laterally spaced from each other and arranged such that the control gate electrode of the first and third transistor face each other and the control gate electrodes of the second and fourth transistor face each other.

The disclosed semiconductor device enables scaling of the device area and circuit density by employing the vertical dimension for orienting the transistor channels. Moreover, the relative orientation of the control gate electrodes and the polarity gate electrodes allows for the polarity gates to be contacted from mutually opposing lateral sides or borders of the device. Thus, a relatively symmetric semiconductor device layout may be provided which is easier to integrate and access in a standard cell configuration.

By "vertical transistor" is hereby meant a stack configuration or arrangement wherein the channel region of the transistor is arranged such that the current in the conducting state flows through the channel mainly in the vertical direction, i.e., perpendicular to a surface/main plane of extension of the substrate. Consequently, the source/drain regions are arranged at different level above, or distance from, the substrate as viewed along the vertical direction.

In an example embodiment, vertical transistors may be rationally and reliably manufactured, wherein each part of the stack may be selectively grown. Further, the channel length may be determined by the vertical thickness of the layer, rather than the resolution of the patterning process used in, e.g., horizontally-oriented devices.

By each transistor including a vertically extending channel, such as a nanostructure or wire channel, the transistors may be provided with gate electrodes (i.e., polarity gate electrodes and/or control gate electrodes) forming gate structures that are completely enclosing or wrapping-around the channels. The transistors may hence be referred to as gate-all around (GAA) transistors. The transistors, and hence the semiconductor device, may thus present desirable electrical characteristics in terms of device control and standby leakage.

The aforementioned transistors may be field-effect transistors (FETs). The transistors may be a p-type FET or an n-type FET depending on the electric field provided by the polarity gate. The control gate electrode may act on the central section of the channel to change the electrical conductivity of the channel, thereby allowing for the on/off behavior of the transistor to be controlled. In other words, the control gate electrode may be used for switching on and off the transistor. The polarity gate may act on regions in proximity to the source/drain regions to affect or define the polarity of the transistor, i.e., whether the transistor should operate as a p-type transistor or n-type transistor. Thus, the polarity gate electrode may be used for changing the state of polarity of the transistor. The electric field on the polarity gate may act either at the interface of the wire-to-source/drain region or anywhere in close proximity to the depleted region of the channel body, controlling the majority carriers passing through the transistor channel by regulating the Schottky barrier thicknesses at the source and drain contacts. Such transistors may also be referred to as ambipolar transistors, allowing the same transistor structure or layout of the device to be used for providing several different types of logic gates.

The gate electrodes may be formed of layers extending in a lateral direction along the substrate. The lateral orientation allows for the gate electrodes to extend in mutually opposite directions relative to the channel, such that the polarity gate and the control gate of each transistor may be contacted from opposing sides of the transistors (as seen in the lateral direction). This orientation may also be referred to as "facing away" from each other. Accordingly, the opposite orientation reduces the risk of the gate electrodes shadowing each other in the vertical direction. Even though each gate electrode (and/or top/bottom electrodes of the transistor structure) may have an extension in several different lateral directions, the above discussion regarding the feature "extending in opposite directions" should be understood as referring to the main extension of the electrode, i.e., a portion of the electrode allowing for different electrodes to be accessed by, e.g., via structures and other interconnecting means without blocking or shadowing each other.

Accordingly, the polarity gate electrodes of the first and third transistor may have a main lateral extension in mutually opposite directions, i.e., such that the gate electrodes extend away from the semiconductor device. This orientation allows for the polarity gates to be contacted outside the region defined by the positions of the transistors. Thus, the polarity gate electrodes of the first and second transistor may extend on one lateral side of the device, whereas the polarity gate electrodes of the third and fourth transistor may extend on another lateral side of the device. To exemplify in standard cell terminology, the polarity gate of the first and second transistor may be contacted at the top of the cell whereas the polarity gate of the third and fourth transistors may be contacted at the bottom of the cell. Using the same terminology, the control gates may be contacted from the middle or center of the standard cell By the term "gate electrode" as used in connection with the control gate electrode and the polarity gate electrode is meant an electrically conductive structure or layer that is capable of forming one or several gates (such as, e.g., one or more polarity gates or a control gate) of a transistor and one or several access points through which the gates may be electrically accessed.

The relative arrangement of the at least four transistors may be understood as a configuration of two mutually opposing pairs of transistors, wherein transistors within each pair are allowed to share a common bottom (or top) electrode and transistors in different pairs to share a common control gate electrode. Accordingly, the control gate electrodes of two opposing transistors may be contacted or accessed by a common contact. Similarly, the bottom (or top) electrodes of two opposing transistors may be contacted or accessed by a common contact.

The sides of the semiconductor device may also be referred to as its boundary, by which is hereby meant a side or outline of a geometrical/imaginary rectangle (oriented parallel to the main surface/plane of extension of the substrate) within which the transistors forming the device are confined. The polarity gate electrodes of the device may accordingly be extended to (or accessed at) a pair of mutually opposite sides of the geometrical rectangle.

A "source/drain" of a transistor may refer to either a source region or a drain region of a transistor. Whether the region acts as a "source" or "drain" may be determined by the voltage applied to the polarity gate, is, as understood by the skilled person, dependent on the type or polarity of transistor (i.e., in which polarity state the channel is operated) and the voltages applied to the device in use.

As used herein, the terminology "electrical (inter-)connection" between elements or elements being "electrically (inter-)connected" should be understood as presence of a galvanic connection between the elements. In other words, a conducting structure is arranged in physical contact with the elements wherein the elements are electrically connected. Conversely, two elements being electrically isolated from each other should be understood as absence of an electrical or galvanic connection between the elements.

The disclosed layout allows for the control gate electrodes of the first and third transistor to be connected to a common first gate contact or via structure, and for the control gate electrodes of the second and fourth transistor to be connected to a common second gate contact or via structure. Thus, the transistors of the semiconductor device may be accessed from two contact points arranged within the region defined by the transistor positions. In some examples, the control gate electrodes of the first and third transistor may be connected in the same layer lever, thus forming a single gate electrode. Similarly, the control gate electrodes of the second and fourth transistor may be connected in the same layer level to form a single gate electrode.

The transistors may comprise a top electrode and a bottom electrode having a lateral extension in mutually opposite directions and perpendicular to the extension of the polarity gate electrodes. Accordingly, the transistors of the semiconductor device may be accessed from four different sides of the device, allowing for the footprint to be reduced.

The transistors may be arranged such that the bottom electrodes of the first and second transistor face each other and the bottom electrodes of the third and fourth transistor face each other, thereby allowing them to be contacted from within the region defined by the transistors. Accordingly, the top electrodes may face away from each other.

It is however equally conceivable to let the bottom electrodes of the transistors face each other, such that the top electrodes face away from each other.

The vertical channel of a transistor may be formed of one or several nanowires. In an example embodiment, the several nanowires extend along each other. Alternatively or additionally, the channel may be formed of one or several nanosheets, i.e., a sheet- or fin-shaped body capable of conducting a current in the vertical direction.

The above-mentioned polarity gate electrodes, control gate electrodes and top/bottom electrodes may be used for interconnecting at least some of the transistors to perform a logical function, wherein the inputs and outputs of the device formed by the transistors may be connected to the surroundings through the electrodes.

In one example, the transistors of the semiconductor device may be interconnected to form, e.g., an XOR gate, in which the control gate electrodes and the polarity gate electrodes are connected to input lines and the bottom electrodes (arranged in mutually facing pair) may be connected to a common output line. The top electrodes (arranged in pairs facing away from each other) may be connected to $V_{dd}/V_{ss}$. The $V_{dd}/V_{ss}$ may, e.g., be provided by buried power lines.

If the top electrodes are connected to input lines instead of power, the semiconductor device may form a majority gate returning true if and only if more than half of its inputs are true.

Even though the examples described herein relate to four-transistor devices, it will be appreciated that other example devices comprising more than four transistors or arrays comprising a plurality of four-transistor devices are possible. For instance, in example embodiments, the semiconductor devices may, e.g., comprise six or eight transistors that may be arranged in two rows of mutually opposing pairs arranged in a similar manner as described above, i.e., wherein the control gate electrode and the polarity gate electrode of each transistor extend in opposite directions and wherein the control gate electrodes within each transistor pair faces each other. Other examples are possible as well.

BRIEF DESCRIPTION OF THE FIGURES

The above, as well as additional, features will be better understood through the following illustrative and non-limiting detailed description of example embodiments, with reference to the appended drawings. In the drawings like numerals will be used for like elements unless stated otherwise.

FIG. 1a is a schematic cross sectional view of a transistor having a control gate electrode and a polarity gate electrode, according to an example embodiment.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1A:
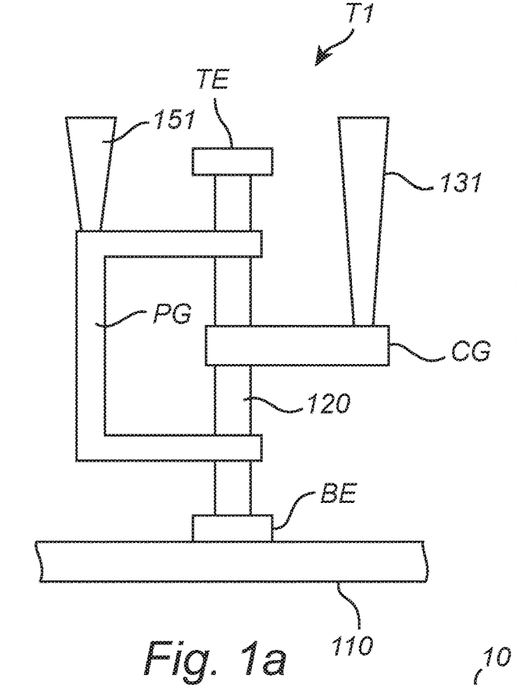

FIG. 1a illustrates a cross sectional side view of a vertical transistor T1 according to an embodiment of the present disclosure. The transistor T1 may, e.g., be a field-effect transistor (FET), such as, e.g., a metal-oxide-semiconductor FET (MOSFET), and may be formed of a stacked structure arranged on a substrate 110. The stack may, e.g., comprise a bottom electrode BE, which, e.g., may be connected to, or form, a drain region, a vertical channel 120, which, e.g., may be formed as a nanowire, and a top electrode TE which, e.g., may be connected to, or form, a source region of the transistor T1. The bottom electrode BE, the channel 120 and the top electrode TE may be arranged above each other relative to the underlying substrate 110, which may extend laterally/horizontally beyond the illustrated portions. The substrate 110 may, for instance, be a (bulk) silicon substrate, a silicon-on-insulator (SOI) substrate, a germanium-on-insulator (GeOI) substrate, or a dielectric substrate.

The bottom/top electrodes BE, TE may enclose or wrap-around at least a portion of the source/drain regions formed by portions of the channel 120. The channel 120 may hence extend into the bottom/top electrodes BE, TE. The bottom/top electrodes BE, TE may, e.g., be formed by one or several metals. They may also be formed by a doped semiconductor material.

Further, a polarity gate electrode PG may be provided to form, e.g., a first and a second polarity gate acting on regions of the channel 120 (e.g., in proximity to the source and drain regions) to alter or change the polarity of the transistor T1. Thus, depending on the electric field on the polarity gates, the transistor T1 may act as an n-type or a p-type transistor. The polarity gate electrode PG may be accessed by, e.g., a via structure 151 or electrical interconnect structure 151, connecting the polarity gate to, e.g., a routing line arranged above the polarity gate electrode PG or to a buried routing line arranged below the polarity gate electrode PG.

A control gate may be formed at a central region, i.e., between the regions of the channel 120 on which the polarity gates acts, by a control gate electrode CG. The control gate electrode CG may be accessed by a via structure 131 or electrical interconnect structure 131 so as to allow the control gate to control the on/off behavior of the channel 120.

Each of the control gate electrode CG and/or the polarity gate electrode PG or, for brevity, the gate electrodes CG, PG may include one or more metals (or alloys thereof), for instance Ti, W, T, Al. The gates, formed by the electrodes CG, PG may also include a gate dielectric (not shown in the Figures). The gate dielectric may include a low-k dielectric such as an oxide (e.g., $SiO_2$), and/or a high-k dielectric (e.g., $HfO_2$ or $ZrO_2$).

As indicated in FIG. 1a, the polarity gate electrode PG may have a main lateral extension in a first direction (also referred to as west, i.e., to the left in the present Figure), whereas the control gate electrode CG has a main lateral extension in a second direction (also referred to as east, i.e., to the right in the present Figure), opposite to the first direction. Thus, it is possible to access the two different gate electrodes CG, PG from opposite sides of the transistor T1 without the gate electrodes CG, PG shadowing each other.

Figure 1B:
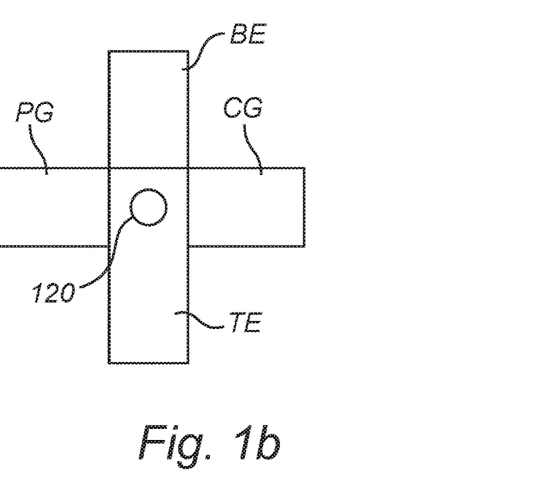
FIG. 1b is a top view of the transistor in FIG. 1a, according to an example embodiment.

This functionality is further described with reference to FIG. 1b, which is a schematic top view of a transistor T1 similarly configured as the transistor of FIG. 1a. As indicated in FIG. 1b, the polarity gate electrode PG and the control gate electrode CG have a main lateral extension in mutually opposite directions. In this specific example of the layout, the polarity gate electrode may be accessed or connected from a position to the left of the channel 120 whereas the control gate electrode CG may be accessed or connected from a position to the right of the channel 120. Similarly, the bottom electrode BE and the top electrode TE may extend in mutually opposite directions (e.g., orthogonal to the directions in which the gate electrodes CG, PG extend). In the example illustrated in the present figure, the bottom electrode BE may extend upwards in the plane of the figure (i.e., north), and the top electrode TE downwards in the plane of the figure (i.e., south). Thus, all four available directions south, north, east and west may be used for accessing the source, drain, polarity gate and control gate of the transistor T1. Even though not shown in FIG. 1b, it will be realized that the gate electrodes CG, PG and the top/bottom electrodes TE, BE may be arranged or extend in vertically separate planes, as indicated in FIG. 1a.

Figure 2:
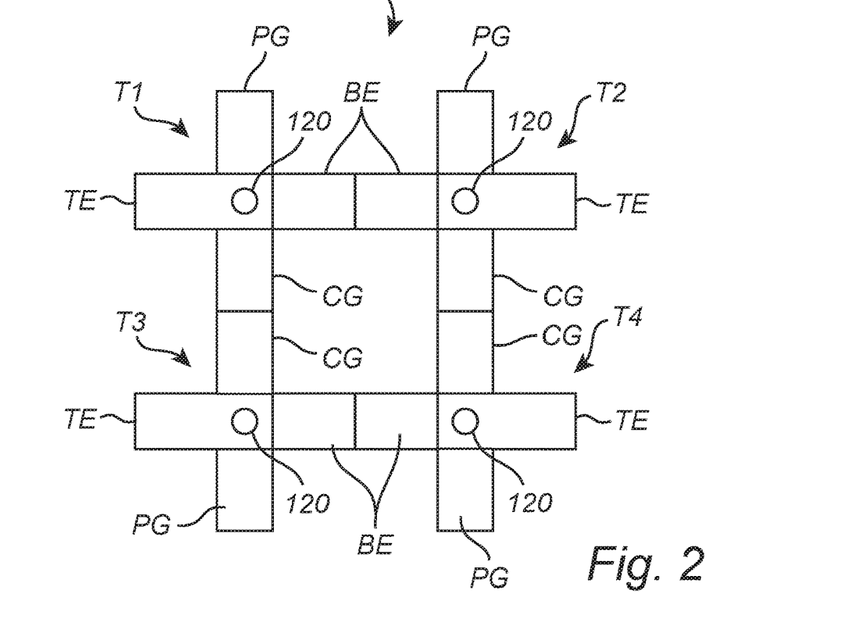
FIG. 2 is a top view of a semiconductor device comprising four transistors similar to the transistor disclosed in FIGS. 1a and b, according to an example embodiment.

The electrode configuration of the transistor T1 illustrated in FIGS. 1a and b above may be utilized as building blocks for building larger devices comprising a plurality of transistors. FIG. 2 is a schematic top view of a semiconductor device 10 formed by a symmetrical arrangement of a first transistor T1, a second transistor T2, a third transistor T3, and a fourth transistor T4, which all may be similarly configured as the transistor T1 discussed above in connection with FIGS. 1a and b. The transistors T1, T2, T3, T4 may be used a tiles or building blocks arranged in two pairs that may be arranged opposite to each other. In other words, the transistors T1, T2, T3, T4 may be placed in a quadrangle (such as, e.g., a square) such that the control gate electrodes CG of the first and the third transistor T1, T3 face each other and such that the control gates CG of the second and the fourth transistors T2, T4 face each other. Further, the bottom electrodes BE (or, in another example, the top electrodes TE) of the first transistor T1 and the second transistor T2 may be arranged to face each other and the bottom electrodes BE (or, in the other example, the top electrodes TE) of the third transistor T3 and the fourth transistor T4 may be arranged to face each other. Thus, a semiconductor device 10 may be provided wherein the bottom electrodes BE and the control gate electrodes CG may be accessed from within the region defined by the positions of the transistors T1, T2, T3, T4 (i.e., inside the device 10). Accordingly, the polarity gate electrodes PG and the top electrodes TE may be accessed from positions outside the device 10 (i.e., at the sides of the device 10). In the specific example illustrated in FIG. 2, the polarity gates of the first transistor T1 and the second transistor T2 may be accessed at the north side of the device 10, whereas the polarity gates of the third transistor T3 and the fourth transistor T4 may be accessed at the south side of the device 10. Accordingly, the top electrode TE of the first transistor T1 and the third transistor T3 may be accessed from the west side of the device 10, and the top electrode TE of the second transistor T2 and fourth transistor T4 accessed from the east side of the device 10. Depending on the desired logic functionality of the device 10, the bottom electrode BE of the first transistor T1 and the second transistor T2 may be connected to each other, such as by a common contact structure, or even be formed of a common layer structure. The same reasoning may apply to the bottom electrodes BE of the third transistor T3 and the fourth transistor T4. Thus, it will be appreciated that the device 10 (and in particular the electrodes BE, TE and the gate electrodes CG, PG) may be formed by deposition of one or several layers, which may be patterned to form the desired contacting structures.

The symmetric configuration of the device 10, wherein the individual transistors T1, T2, T3, T4 are used as building blocks, may be extended by one or several transistors to achieve a desired functionality. The layout disclosed in the present figure provides an example for illustrating example differences with the opposite configuration of the polarity gate electrode PG and the control gate electrode CG as initially discussed in connection with FIGS. 1a and b.

Figure 3A:
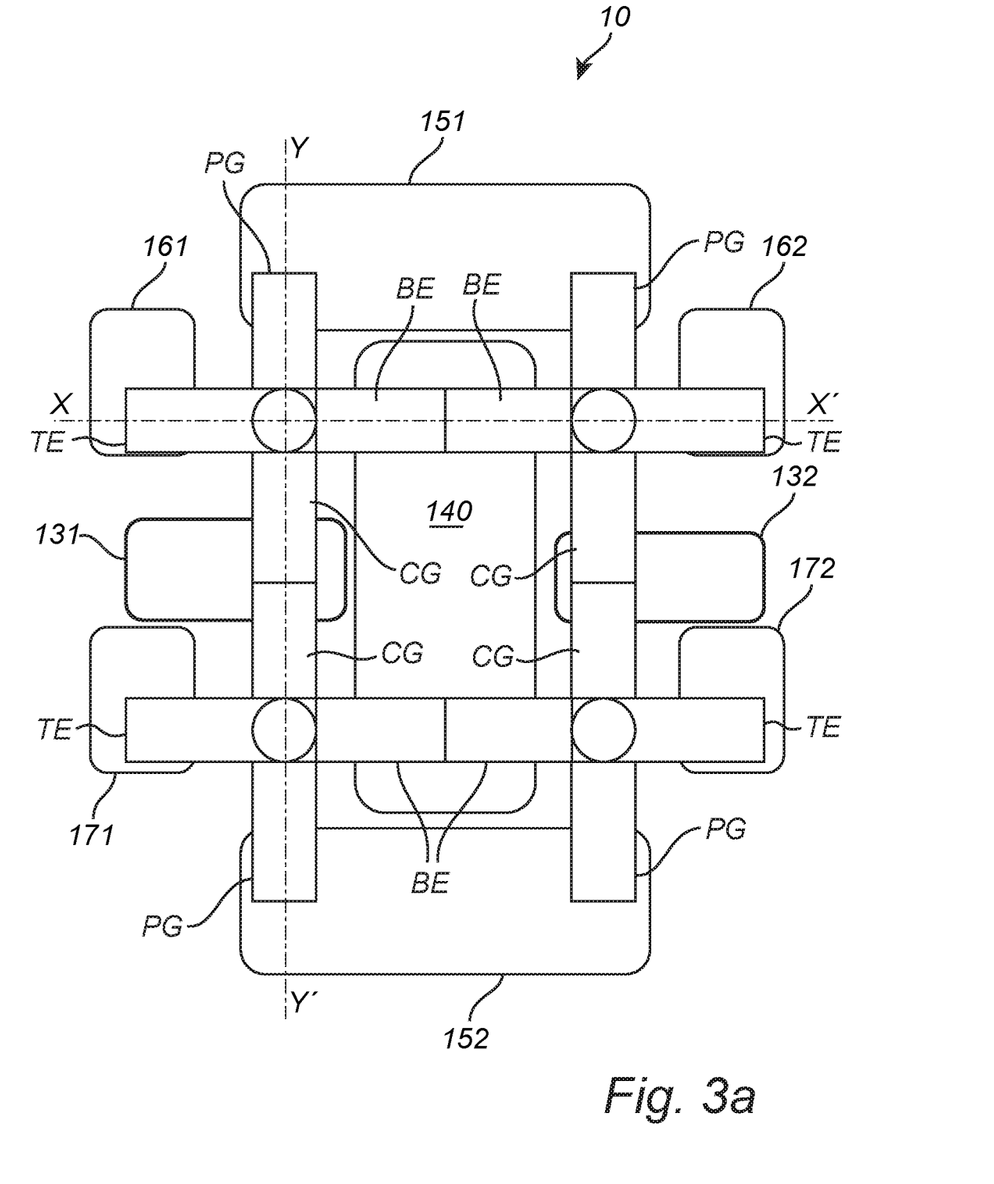
FIG. 3a shows the layout of a semiconductor device in an XOR gate arrangement, according to an example embodiment.

FIG. 3a discloses a schematic layout of device 10 in an example where device 10 is in an XOR gate arrangement (thus device 10 of FIG. 3a may also be referred to herein as "XOR gate device 10" or "XOR gate 10"), comprising at least four transistors T1, T2, T3, T4 similarly configured as discussed in connection with FIG. 2. In the present example, the top electrodes TE of the first transistor T1 and the fourth transistor T4 may be connected to $V_{dd}$ by a respective contact 161, 172, whereas the top electrodes TE of the second transistor T2 and third transistor T3 may be connected to $V_{ss}$ by a respective contact 162, 171. The input to the XOR gate 10 may be represented by A, xA, B and xB, and the output by Y. Input A may be connected to the control gates CG of the first transistor T1 and the third transistor T3 by means of a common contact (e.g., structure 131), and input xA to the control gates CG of the second transistor T2 and the fourth transistor T4 by a common contact 132. Further, input B may be connected to polarity gates PG of the third transistor T3 and the fourth transistor T4 by via a common contact 152, and the input xB to the polarity gates of the first transistor T1 and the second transistor T2 through common contact 151.

Figure 3B:
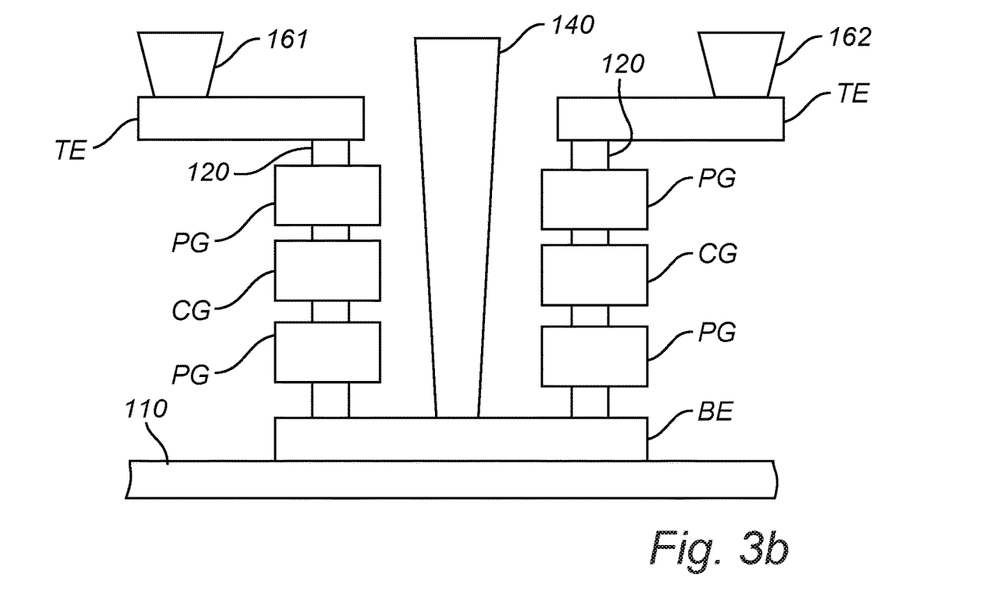
FIGS. 3b and 3c are schematic cross sections of the device in FIG. 3a, according to an example embodiment.

FIG. 3b shows a vertical cross section of the XOR gate 10 of FIG. 3a, taken along line X-X'. The first transistor T1 and the second transistor T2 may comprise a respective channel 120 (e.g., formed as a vertical nanowire) arranged on a substrate 110. As indicated, the vertical nanowires of the first and second transistor T1, T2 may share a common bottom electrode BE, which, e.g., may be formed as an electrically conductive layer arranged on the substrate 110. The bottom electrode BE may be connected from above by means of an interconnect structure, such as, e.g., a via 140, extending between an output line Y and the bottom electrode at a position between the first transistor T1 and the second transistor T2.

Each of the transistors T1, T2 may comprise a stacked structure formed of a polarity gate electrode PG and a control gate electrode CG, wherein the polarity gate electrode PG may form two distinct polarity gates acting on two vertically separated portions of the channel 120 to control the polarity type of the respective transistor. Further, a control gate electrode CG may be arranged to form a control gate acting on a portion therebetween so as to control the on/off behavior of the channel 120/transistor T1, T2.

The top portion of the channel 120 of the first transistor T1 and the second transistor T2 may be connected to a respective top electrode TE, which may be arranged to extend laterally away from each other. The top electrodes TE may be connected to $V_{dd}/V_{ss}$ through a respective via 161, 162.

As illustrated in the present cross section, the bottom electrode BE and the top electrode TE may have a main lateral extension in separate planes, just as the control gate electrode CG and the polarity gate electrode PG.

Figure 3C:
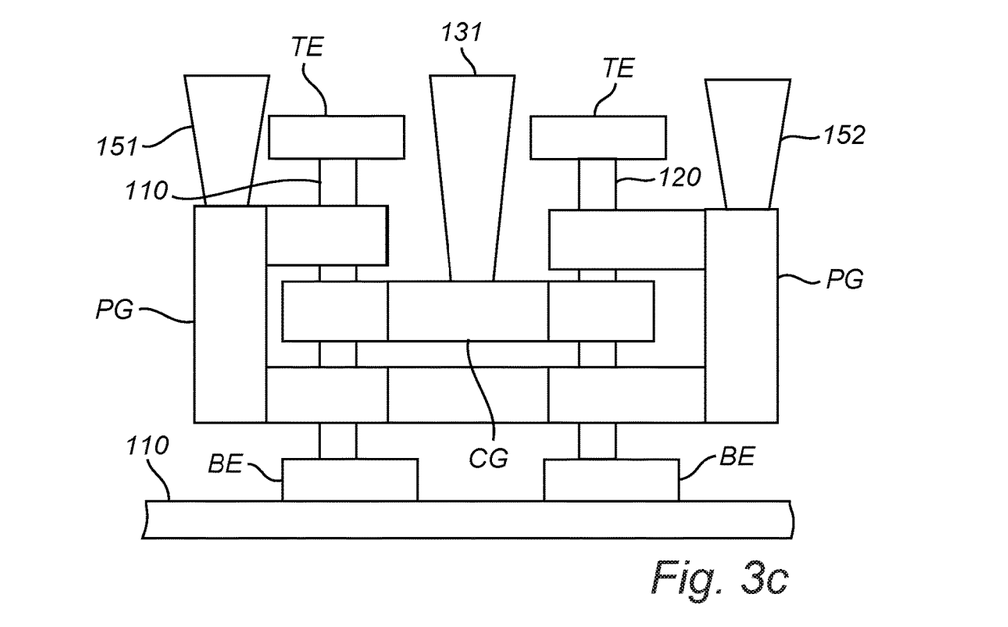

FIG. 3c is a vertical cross section of the XOR gate 10 of FIG. 3a, taken along line Y-Y'. In the present figure, the control gate electrode CG and the polarity gate electrode PG of the first transistor T1 and the third transistor T3 may have a main lateral extension in opposite directions, allowing the polarity gates to be contacted from outside the device 10 (i.e., at the sides facing away from the first and third transistor T1, T3) and the control gate to be contacted from within the device 10 (i.e., at a region between the first and third transistor T1, T3). The control gate electrode CG may be a common electrode contacted to input A by means of, e.g., a via structure 131. The polarity gate electrodes PG may be connected to B and xB inputs by means of the interconnects 151, 152, respectively.

The semiconductor XOR gate device 10 as indicated in FIGS. 3a-c may thus be connected to $V_{dd}/V_{ss}$ on its east and west side, with input A, xA arranged between the $V_{ss}/V_{dd}$ connections 161, 171. Further, the device 10 may be connected to B and xB input via interconnect structures 151, 152.

Figure 4:
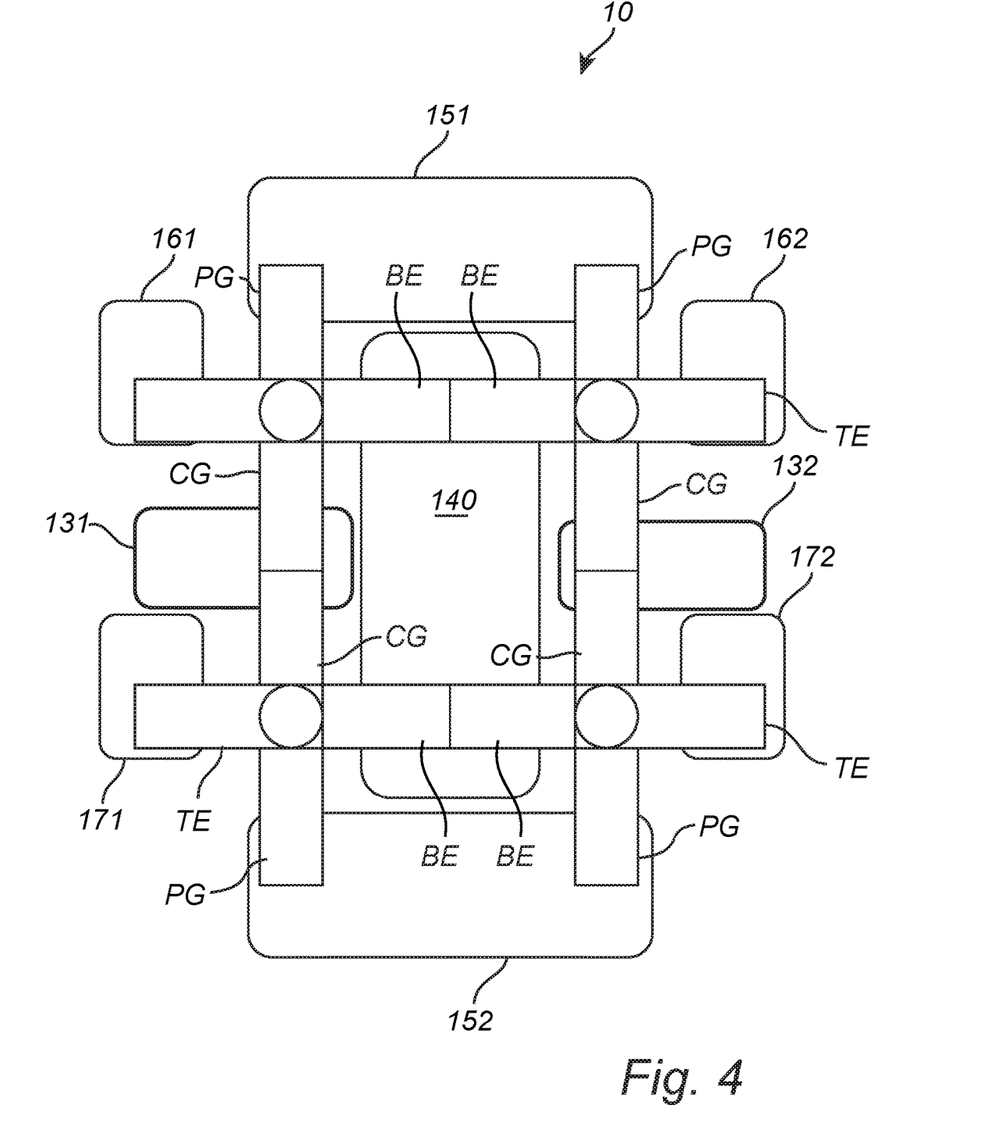
FIG. 4 illustrates a semiconductor device in a majority gate configuration, according to an example embodiment.

The semiconductor device 10 according to the above embodiments may be also be arranged in a majority gate configuration, as indicated in FIG. 4, which may be similar to the configuration as disclosed in connection with FIGS. 3a-c. The majority gate configuration, however, differs in that the top electrodes TE of the first and fourth transistor T1, T4 may be connected to input C, via connections 161, 172, instead of $V_{dd}$. Further, the top electrodes TE of the second and third transistors T2, T3 may be connected to input A, via interconnection 162, 171, instead of $V_{ss}$. This configuration allows for the semiconductor to be operated as a majority gate.

As used herein, the terminology "may" (e.g., may be formed of, may include, etc.) should be understood as meaning that in an example embodiment, the system or device comprises that described feature (e.g., is formed of, does include, etc.).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A semiconductor device comprising:
   a substrate; and
   at least a first, a second, a third, and a fourth vertical transistor supported by the substrate;
   wherein each one of the vertical transistors comprises:
      a vertical channel having a length axis perpendicular to a main plane of extension of the substrate;
      a polarity gate electrode forming a polarity gate adapted to act on a first portion of the vertical channel to affect a polarity of the vertical channel; and
      a control gate electrode forming a control gate adapted to act on a second portion of the vertical channel to control an electrical conductivity of the vertical channel;
   wherein the polarity gate electrode and the control gate electrode of each one of the vertical transistors extend laterally from their respective gate and in mutually opposite directions; and
   wherein the vertical channels are laterally spaced from each other and arranged such that the control gate electrodes of the first and third vertical transistors face each other and the control gate electrodes of the second and fourth vertical transistors face each other.

2. The semiconductor device according to claim 1, wherein each one of the vertical transistors is arranged in a respective corner of a quadrangle outline.

3. The semiconductor device according to claim 1, wherein the control gate electrodes of the first and third vertical transistors are connected to each other and to a common first gate contact, and wherein the control gate electrodes of the second and fourth vertical transistors are connected to each other and to a common second gate contact.

4. The semiconductor device according to claim 1, wherein each one of the vertical transistors comprises a top electrode connected to an upper portion of the vertical channel and a bottom electrode connected to a lower portion of the vertical channel, and wherein the top electrode and the bottom electrode extend laterally away from the vertical channel in mutually opposite directions perpendicular to an extension of the polarity gate electrode or control gate electrode.

5. The semiconductor device according to claim 4, wherein each one of the vertical transistors is arranged such that the bottom electrodes of the first and second vertical transistors face each other and the bottom electrodes of the third and fourth vertical transistors face each other.

6. The semiconductor device according to claim 5, wherein the bottom electrodes of the vertical transistors are connected to each other and to a common electrode contact.

7. The semiconductor device according to claim 1, wherein the vertical channel of at least one of the vertical transistors is formed of at least one nanowire.

8. The semiconductor device according to claim 7, wherein the vertical channel comprises a plurality of nanowires.

9. The semiconductor device according to claim 1, wherein the vertical channel is formed of a vertical nano-sheet.

10. The semiconductor device according to claim 1, wherein the polarity gate electrode is adapted to act on a first portion the vertical channel close to a source of the vertical transistor and to a second portion close a drain of the vertical transistor, and wherein the control gate electrode is adapted to act on the channel at a portion therebetween.

11. The semiconductor device according to claim 1, wherein the vertical transistors are interconnected to form an XOR gate.

12. The semiconductor device according to claim 1, wherein the vertical transistors are interconnected to form a majority gate.

13. The semiconductor device according to claim 1, wherein each one of the vertical transistors is a gate-all around transistor.

14. The semiconductor device according to claim 1, wherein each one of the vertical transistors is a field-effect transistor.

15. A semiconductor device, comprising:
   a substrate; and
   at least a first, a second, a third, and a fourth vertical transistor supported by the substrate;
   wherein each one of the vertical transistors comprises:
      a vertical channel;
      a polarity gate electrode forming a polarity gate adapted to act on a first portion of the vertical channel to affect a polarity of the vertical channel; and
      a control gate electrode forming a control gate adapted to act on a second portion of the vertical channel to control an electrical conductivity of the vertical channel;
   wherein the polarity gate electrode and the control gate electrode of each one of the vertical transistors extend laterally from their respective gate and in mutually opposite directions; and
   wherein the vertical channels are laterally spaced from each other and arranged such that the control gate electrodes of the first and third vertical transistors face each other and the control gate electrodes of the second and fourth vertical transistors face each other.

16. The semiconductor device according to claim 15, wherein the control gate electrodes of the first and third vertical transistors are connected to each other and to a common first gate contact, and wherein the control gate electrodes of the second and fourth vertical transistors are connected to each other and to a common second gate contact.

17. The semiconductor device according to claim 15, wherein the vertical channel of at least one of the vertical transistors comprises at least one nanowire.

18. The semiconductor device according to claim 15, wherein each one of the vertical transistors is arranged in a respective corner of a quadrangle outline.

19. The semiconductor device according to claim 15, wherein each one of the vertical transistors comprises a top electrode connected to an upper portion of the vertical channel and a bottom electrode connected to a lower portion of the vertical channel, and wherein the top electrode and the bottom electrode extend laterally away from the vertical channel in mutually opposite directions perpendicular to an extension of the polarity gate electrode or control gate electrode.

20. The semiconductor device according to claim 15, wherein the vertical channel of at least one of the vertical transistors is formed of a vertical nano-sheet.

* * * * *